United States Patent [19]
Matsui et al.

[11] Patent Number: 5,589,029
[45] Date of Patent: Dec. 31, 1996

[54] SEMICONDUCTOR CHIP-SUPPLY METHOD AND APPARATUS

[75] Inventors: Hisako Matsui, Neyagawa; Akira Kabeshita, Hirakata, both of Japan

[73] Assignee: Matsushita Electric Industrial Co., Ltd., Osaka-Fu, Japan

[21] Appl. No.: 504,748

[22] Filed: Jul. 20, 1995

[30] Foreign Application Priority Data

Jul. 21, 1994 [JP] Japan ................................. 6-169447

[51] Int. Cl.⁶ ................................................. B32B 35/00
[52] U.S. Cl. .................... 156/344; 156/584; 437/226; 294/64.1
[58] Field of Search ......................... 156/344, 584; 437/226; 294/64.1; 279/3

[56] References Cited

U.S. PATENT DOCUMENTS

| | | | |
|---|---|---|---|
| 4,850,780 | 7/1989 | Safabakhsh et al. | 156/344 X |
| 4,859,269 | 8/1989 | Nishiguchi | 156/344 X |
| 5,348,316 | 9/1994 | Lin | 279/3 |

FOREIGN PATENT DOCUMENTS

| | | | |
|---|---|---|---|
| 3336606 | 4/1985 | Germany | 437/226 |
| 56-50530 | 5/1981 | Japan | 437/226 |
| 62-128139 | 6/1987 | Japan | 156/584 |
| 62-166536 | 7/1987 | Japan | 156/584 |
| 62-210635 | 9/1987 | Japan | 156/144 |
| 62-232935 | 10/1987 | Japan | 156/584 |
| 2-66957 | 3/1990 | Japan | 156/584 |

*Primary Examiner*—Mark A. Osele
*Attorney, Agent, or Firm*—Wenderoth, Lind & Ponack

[57] ABSTRACT

A semiconductor chip-supply apparatus includes a sucking member, provided below an adhesive sheet, for sucking the adhesive sheet thereto, thus holding the adhesive sheet thereon. A semiconductor chip is bonded to an upper face of the adhesive sheet, which is positioned below the semiconductor chip. A push-up needle has a tip thereof positioned in a vicinity of a lower face of the adhesive sheet. A driving mechanism moves the sucking member and the adhesive sheet sucked thereto and held by the sucking member downward relatively to the push-up needle. A sucking collet for sucking and transporting the semiconductor chip separated from the adhesive sheet by a push-up operation of the push-up needle moves upward relatively to the sucking member and the adhesive sheet, the operation being caused by the downward movement of the sucking member and the adhesive sheet, which is caused by the driving mechanism.

11 Claims, 6 Drawing Sheets

SEMICONDUCTOR CHIP-SUPPLY METHOD AND APPARATUS

BACKGROUND OF THE INVENTION

The present invention relates to a method for supplying a film carrier with a plurality of semiconductor chips which have adhered to a diced adhesive sheet by separating the semiconductor chips one by one from the adhesive sheet and an apparatus for carrying out the method.

An inner lead bonding apparatus as shown in FIG. 3 is known. A recognizing camera 1 recognizes the images of semiconductor chips 3 which have been attached to a diced adhesive sheet 2. The image-recognized semiconductor chips 3 are separated one by one from the adhesive sheet 2, as will be described later. The semiconductor chips 3 are then sucked to a sucking collet 4 (sucking nozzle) and supplied to a film carrier 5. Then, a bonding tool 6 bonds the semiconductor chip 3 one by one to the film carrier 5. Reference numeral 7 denotes a wafer ring.

The semiconductor chips 3 are obtained by dicing a semiconductor wafer 8 as shown in FIG. 4A. As shown in FIG. 4B, the semiconductor chips 3 are bonded to the upper surface of the stretched adhesive sheet 2. As shown in FIG. 4C, the semiconductor chips 3, image-recognized by the recognizing camera 1, are then separated from the adhesive sheet 2. Then each semiconductor chip 3 is sucked to the sucking collet 4 and transported toward the film carrier 5 as shown in FIG. 4D.

Referring to FIGS. 5A through 5F, an operation to be performed by a conventional semiconductor chip-supply apparatus is described in detail below. At a stage shown in FIG. 5A, the semiconductor chip 3 is bonded to the adhesive sheet 2. When the adhesive sheet 2 has been moved upward by a sucking ring 9 provided below the adhesive sheet 2, the recognizing camera 1 recognizes the image of the semiconductor chip 3. Then, the sucking collet 4 is moved to above and downward toward the semiconductor chip 3 as shown in FIG. 5B. As a result, a slight gap is formed between the sucking collet 4 and the semiconductor chip 3 as shown in FIG. 5C.

At a stage shown in FIG. 5D, push-up needles 10 are moved upward, with the sucking ring 9 being stationary. The sucking collet 4 starts an upward movement synchronously with the start of the upward movement of the push-up needles 10. While the push-up needles 10 are moving upward, the needles 10 push the semiconductor chip 3 upward. As a result, the semiconductor chip 3 is separated from the adhesive sheet 2. Then, as shown in FIG. 5E, the semiconductor chip 3 is sucked to the sucking collet 4 and then transported toward the film carrier 5 as shown in FIG. 5F.

The above-described construction has, however, a consideration in that unless the upward movement of the sucking collet is started synchronously with the start of the upward movement of the push-up needles, trouble as shown in FIGS. 6A, 6B, and 6C occurs. Therefore, it is necessary to provide the semiconductor chip-supply apparatus with a complicated mechanism for controlling the operation of the push-up needles and that of the sucking collet so that the start timing in the former and in the latter are synchronized with each other in the upward movements thereof. FIG. 6A shows a case in which the sucking collet 4 has started an upward movement earlier than the push-up needles 10. In this case, the sucking collet 4 is liable to suck the semiconductor chip 3 inappropriately. FIGS. 6B and 6C show a case in which the push-up needles 10 have started an upward movement earlier than the sucking collet 4. In this case, an excessive pressure is applied to the semiconductor chip 3 and the push-up needles 10, thus damaging or breaking them.

SUMMARY OF THE INVENTION

An object of the present invention is to provide an improved semiconductor chip-supply method which allows a semiconductor chip to be separated from an adhesive sheet without controlling the start timing of a sucking collet and a push-up needle in the upward movements thereof, and a semiconductor chip-supply apparatus for carrying out the method.

In accomplishing these and other objects, according to one aspect of the present invention, there is provided a semiconductor chip-supply apparatus comprising a sucking member provided below an adhesive sheet for sucking the adhesive sheet thereto, thus holding the adhesive sheet thereon with a semiconductor chip bonded to an upper face of the adhesive sheet, the adhesive sheet thus positioned below the semiconductor chip. A push-up needle has a tip thereof positioned in the vicinity of a lower face of the adhesive sheet. A driving mechanism moves the sucking member and the adhesive sheet sucked to and held by the sucking member downward relatively to the push-up needle. A sucking collet sucks and transports the semiconductor chip separated from the adhesive sheet by a push-up operation of the push-up needle, which moves upward relatively to the sucking member and the adhesive sheet, the operation being caused by the downward movement of the sucking member and the adhesive sheet caused by the driving mechanism.

According to another aspect of the present invention, there is provided a semiconductor chip-supply method comprising the steps of:

sucking and holding an adhesive sheet by a sucking member provided below the adhesive sheet, with a semiconductor chip bonded to an upper face of the adhesive sheet;

moving the sucking member and the adhesive sheet downward so as to move a push-up needle upward relatively to the sucking member and the adhesive sheet sucked to and held by the sucking member, and thus separating the semiconductor chip from the adhesive sheet by a push-up operation of the push-up needle, which has a tip thereof positioned in a vicinity of a lower face of the adhesive sheet that is being moved downward; and sucking and transporting the semiconductor chip separated from the adhesive sheet by a sucking collet.

According to the semiconductor chip-supply method and the semiconductor chip-supply apparatus for carrying out the method, the sucking ring and the adhesive sheet sucked to and held by the sucking ring are moved downward, with the push-up needle being stationary. Thus, the semiconductor chip can be reliably separated from the adhesive sheet. That is, the construction and the method eliminate the need for synchronizing the movement of the push-up needle and that of the sucking collet with each other, thus allowing the method to perform a simple adjustment. In addition, the semiconductor chip separated from the adhesive sheet is safely transported to a film carrier without trouble. The construction of the apparatus eliminates the need for synchronizing the movement of the push-up needle and that of the sucking collet with each other, thus allowing the apparatus to have a simple construction and adjustment. In addition, the semiconductor chip is separated from the adhesive sheet so as to be safely transported to a film carrier without trouble.

BRIEF DESCRIPTION OF THE DRAWINGS

These and other objects and features of the present invention will become clear from the following description taken in conjunction with the preferred embodiments thereof and with reference to the accompanying drawings, in which:

FIGS. 5A, 5B, 5C, 5D, 5E, and 5F are explanatory views showing the operation of a conventional semiconductor chip-supply apparatus; and.

DETAILED DESCRIPTION OF THE PREFERRED EMBODIMENTS

Figure 1B:
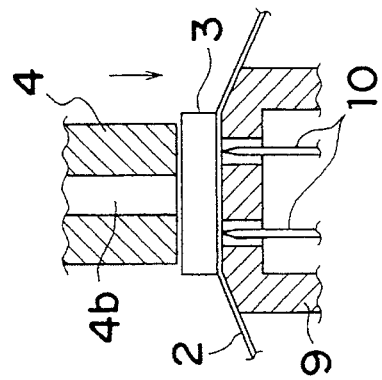
FIGS. 1A, 1B, 1C, 1D, 1E, and 1F are explanatory views showing the operation of a semiconductor chip-supply apparatus according to an embodiment of the present invention.

Before the description of the present invention proceeds, it is to be noted that like parts are designated by like reference numerals throughout the accompanying drawings.

A semiconductor chip-supply method and a semiconductor chip-supply apparatus for carrying out the method according to an embodiment of the present invention are described below.

Figure 1C:
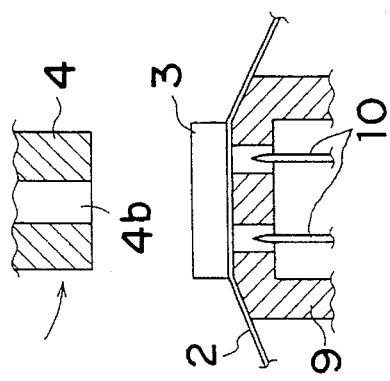
Figure 1A:
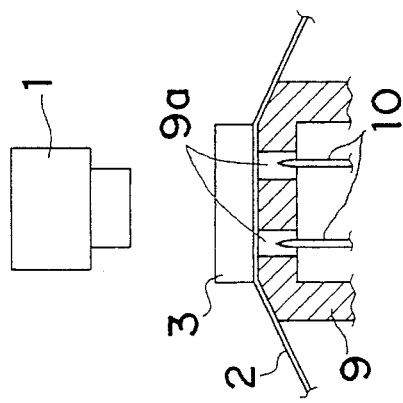

As shown in FIG. 1A, an adhesive sheet 2 is sucked to and held by a sucking ring 9 provided below the adhesive sheet 2, with a semiconductor chip 3 bonded to the bonding face of the adhesive sheet 2, which is positioned below the semiconductor chip 3. The bonding face of the adhesive sheet 2 is upwardly directed. The sucking ring 9 serving as a sucking member has suction holes 9a for sucking the adhesive sheet 2 and relatively moving the push-up pins 10 therethrough. A recognizing camera 1 recognizes the image of the semiconductor chip 3 when the sucking ring 9 has lifted the adhesive sheet 2. Then, as shown in FIG. 1B, based on the result of the recognition, a sucking collet 4 having a suction hole 4b for sucking the semiconductor chip 3 is moved to a position above and then downward toward the semiconductor chip 3, with the result that a slight gap is formed between the semiconductor chip 3 and the sucking collet 4, as shown in FIG. 1C. The tip of each of the push-up needles 10 is moved upward to and positioned in the vicinity of the underside of the adhesive sheet 2.

Figure 1F:
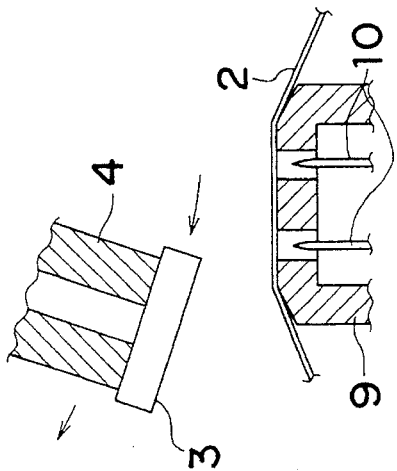
Figure 1E:
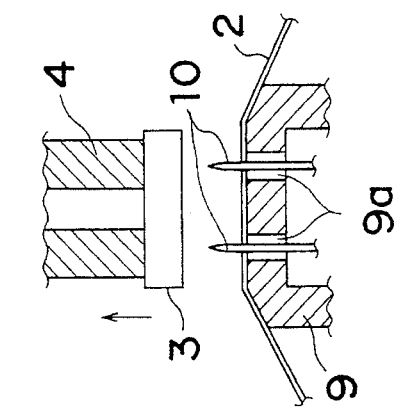
Figure 1D:
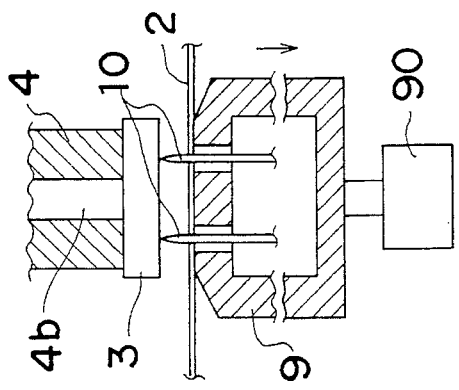

At a stage as shown in FIG. 1D, the sucking ring 9 is moved downward by a driving mechanism 90, such as a cylinder, with the push-up needles 10 being stationary and with the sucking ring 9 holding the adhesive sheet 2 thereon by sucking it thereto. The tip of each of the push-up needles 10 is positioned in the vicinity of the underside of the adhesive sheet 2. Thus, each upper end of the push-up needles 10 pierces the adhesive sheet 2 while the adhesive sheet 2 is moving downward, with the adhesive sheet 2 being held by the sucking ring 9. The push-up needles 10 are moved upward relatively to the sucking ring 9 and the adhesive sheet 2. Accordingly, the semiconductor chip 3 is pushed upward by the push-up needles 10 and separated from the adhesive sheet 2.

After the sucking collet 4 sucks the semiconductor chip 3 separated from the adhesive sheet 2 thereto, the sucking collet 4 is moved upward as shown in FIG. 1E. Then, as shown in FIG. 1F, the sucking ring 9 is moved upward and is returned to the original position and the sucking collet 4 is rotated from above the sucking ring 9 to another position for transport. Therefore, this construction eliminates the need for synchronizing the upward movement of the push-up needles 10 and that of the sucking collet 4 with each other, thus allowing the semiconductor chip 3 to be transported to a film carrier etc. without trouble.

Figure 2A:
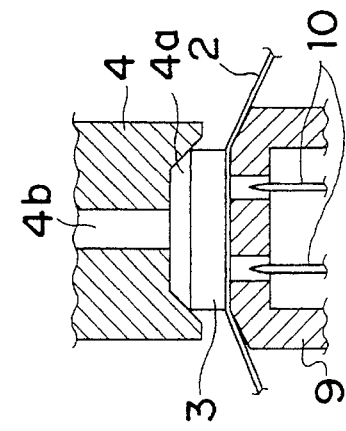
FIGS. 2A, 2B, 2C, 2D, 2E, and 2F are explanatory views showing the operation of a semiconductor chip-supply apparatus according to another embodiment of the present invention.
Figure 2B:
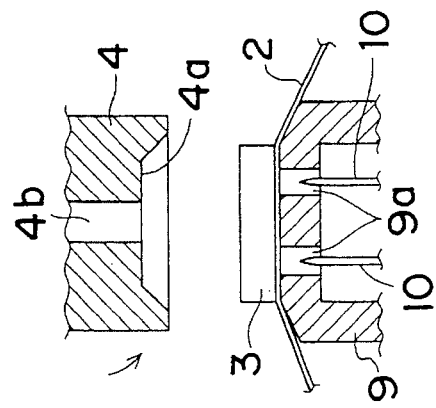
Figure 2C:
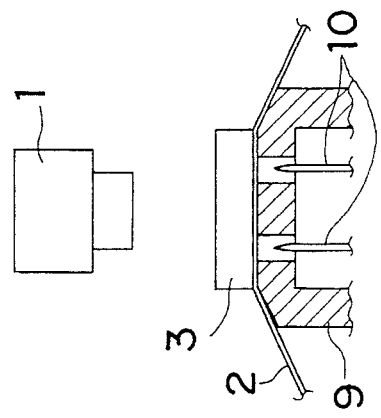

As described above, the sucking ring 9 and the adhesive sheet 2 held thereby are moved downward, with the sucking collet 4 and the push-up needles 10 being stationary. Accordingly, unlike the conventional apparatus, the troubles caused by not-synchronizing of the push-up needles 10 and the sucking collet 4 as described previously do not occur. There is a possibility that unexpected trouble occurs if the upper surface of the semiconductor chip 3 is brought into contact with the sucking collet 4. In consideration of this possibility, in another embodiment, a recess 4a is formed on the sucking face of the sucking collet 4, as shown in FIGS. 2A–2F. The section of the recess 4a is trapezoidal so as to bring the corners of the semiconductor chip 3 into contact with the inclined surface of the recess 4a, as shown in FIG. 2C, without bringing the circuit-forming-surface of the semiconductor chip 3 into contact with the inner surface of the recess 4a. Thus, this recess 4a can prevent the circuit-forming-surface of the semiconductor chip 3 from being damaged deteriorating the quality of the chip 3.

The operation of the semiconductor chip-supply apparatus according to this embodiment is described below. After the image of the semiconductor chip 3 is recognized by the recognizing camera 1 as shown in FIG. 2A, the sucking collet 4 having the recess 4a on the sucking face thereof moves to above the semiconductor chip 3 as shown in FIG. 2B. Because the recess 4a is trapezoidal in section, with the downward movement of the sucking collet 4, the corners of the semiconductor chip 3 are brought into contact with the inclined surface of the recess 4a as shown in FIG. 2C.

Figure 2D:
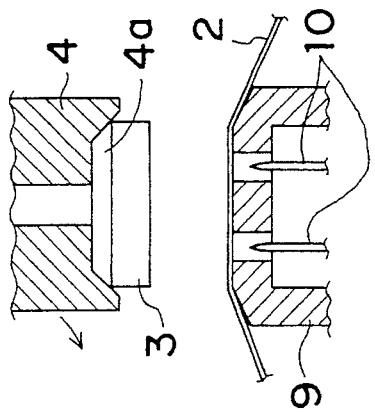
Figure 2E:
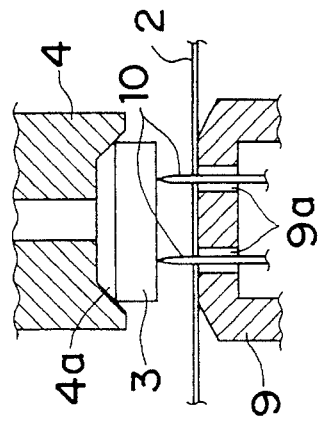
Figure 2F:
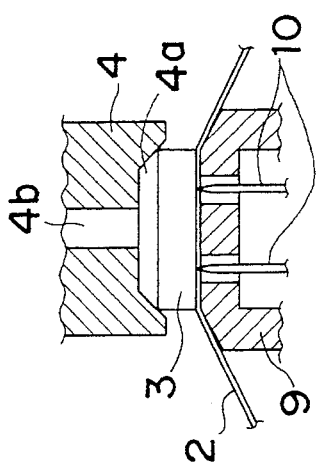
Figure 3:
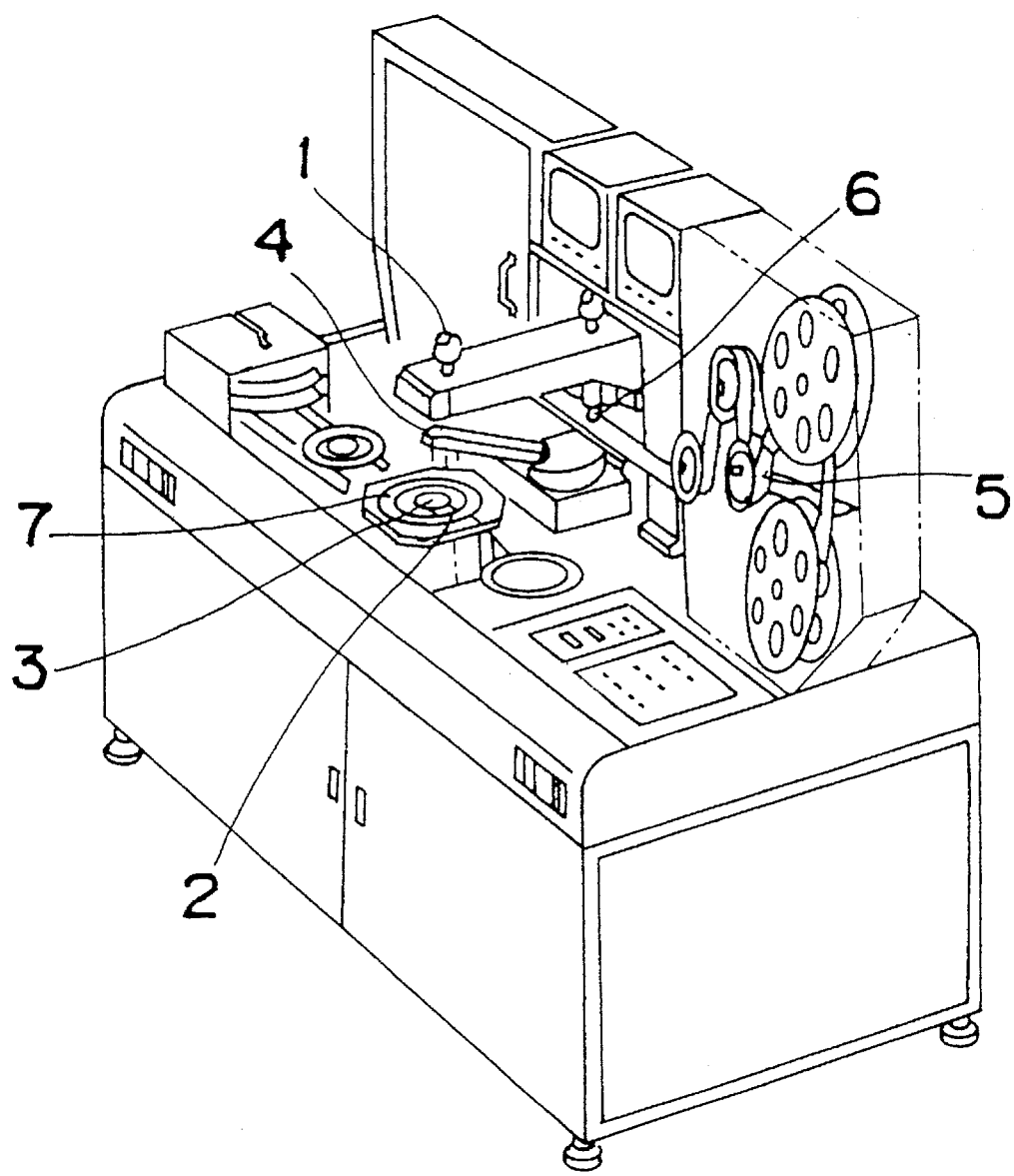
FIG. 3 is a perspective view showing an inner lead bonding apparatus.
Figure 4A:
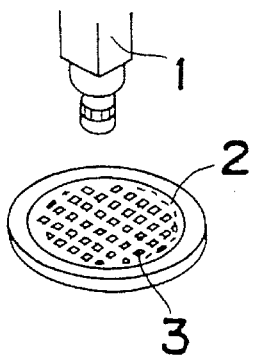
FIGS. 4A, 4B, 4C, and 4D are explanatory views showing a process of supplying a semiconductor chip to a film carrier after dicing process, image recognition process, and transport process.
Figure 4B:
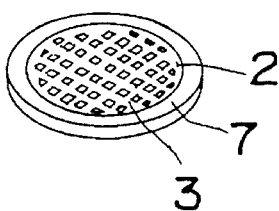
Figure 4C:
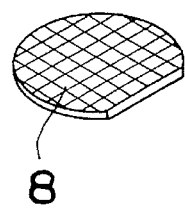
Figure 4D:
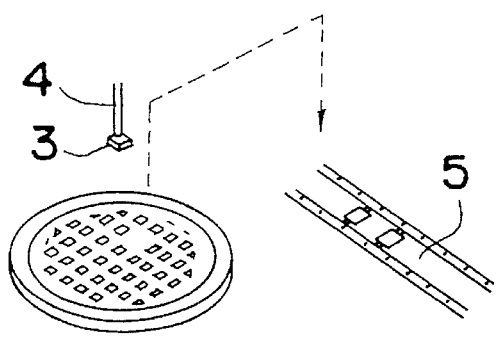
Figure 5A:
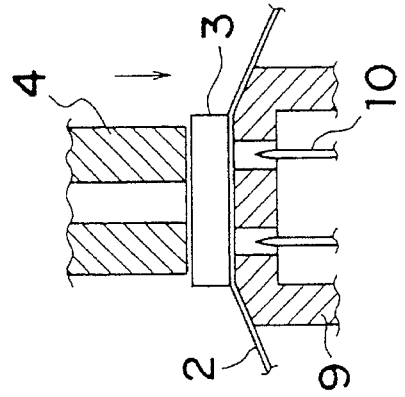
Figure 5B:
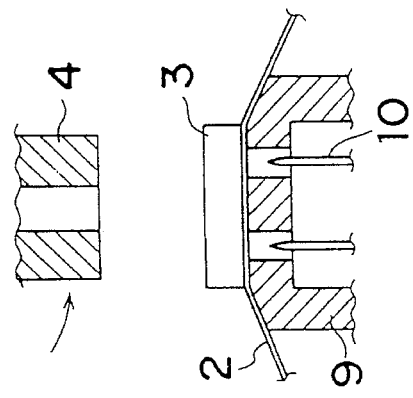
Figure 5C:
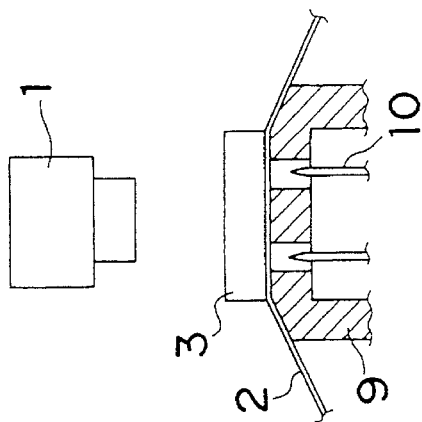
Figure 5D:
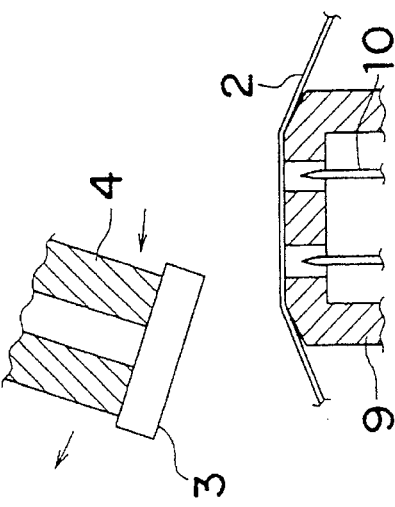
Figure 5E:
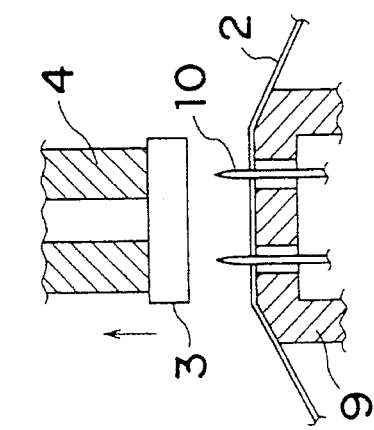
Figure 5F:
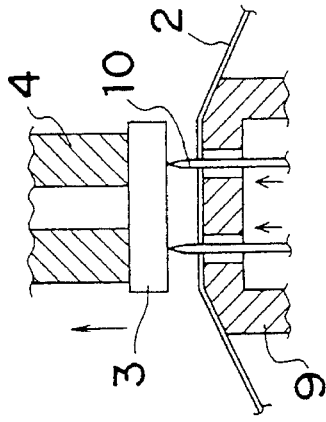
Figure 6A:
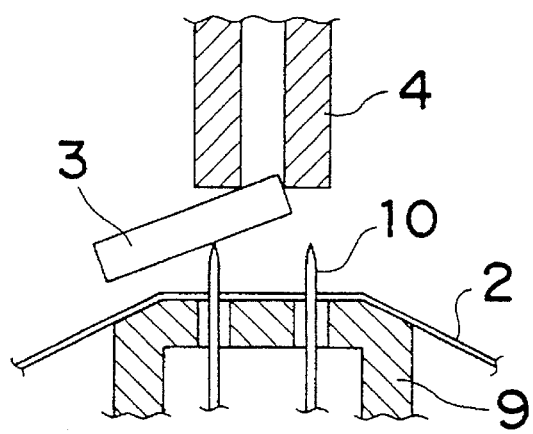
FIGS. 6A, 6B, and 6C are explanatory views showing a trouble which occurs due to the unsynchronous movement of push-up needles and a sucking collet.
Figure 6B:
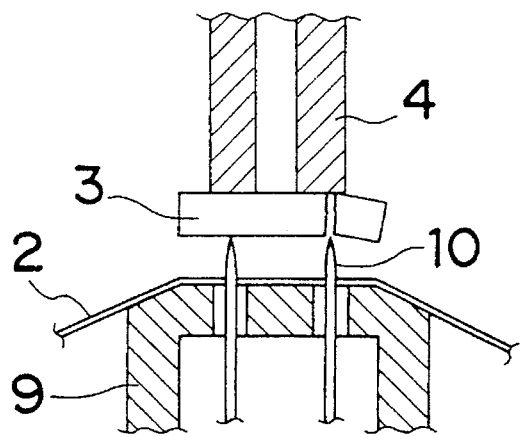
Figure 6C:
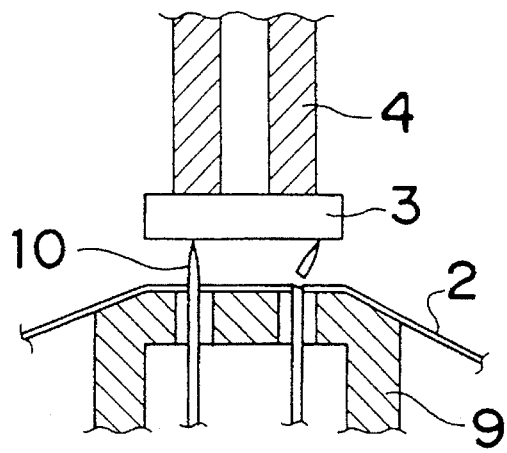

At a stage shown in FIG. 2D, the push-up needles 10 move upward slightly relatively to the sucking ring 9 and the adhesive sheet 2, but the recess 4a prevents the upper surface of the semiconductor chip 3 from being brought into contact with the sucking collet 4. When the semiconductor chip 3 is in contact with the inclined surface of the recess 4a, the semiconductor chip 3 is sandwiched between the sucking collet 4 and the push-up needles 10. In this state, the sucking ring 9 holding the adhesive sheet 2 thereon is moved downward as shown in FIG. 2E. As a result, the push-up needles 10 pierce the adhesive sheet 2, thus projecting therefrom. Consequently, the semiconductor chip 3 is separated from the adhesive sheet 2. Then, as shown in FIG. 2F, the sucking collet 4 sucks the semiconductor chip 3 thereto and holds it thereon; the sucking ring 9 is moved upward and returned to the original position; the push-up needles 10 are moved downward relatively to the sucking ring 9 and the adhesive sheet 2 and returned to the original position; and the sucking collet 4 is rotated from above the sucking ring 9 to the film carrier, thus transporting the semiconductor chip 3 to the film carrier.

In this embodiment, the adhesive sheet 2 is moved downward, with the semiconductor chip 3 being sandwiched between the sucking collet 4 and the push-up needles 10. Thus, the semiconductor chip 3 can be safely separated from the adhesive sheet 2 without dislocation occurring between the semiconductor chip 3 and the sucking collet 4 or the surface of the semiconductor chip 3 being damaged.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor chip-supply apparatus, comprising:

a sucking member disposed below an adhesive sheet and having a suction face for sucking a lower face of the adhesive sheet thereto and holding the adhesive sheet thereon, a semiconductor chip being bonded to an upper face of the adhesive sheet with the adhesive sheet being positioned below the semiconductor chip;

a push-up needle that has a tip thereof positioned adjacent to the lower face of the adhesive sheet;

a driving means for moving said sucking member and the adhesive sheet that is sucked to and held by said sucking member downward relative to said push-up needle so as to cause relative upward movement of said push-up needle with respect to said sucking member and the adhesive sheet such that said push-up needle can carry out a push-up operation while said sucking member sucks the adhesive sheet thereto; and a sucking collet for sucking and transporting the semiconductor chip separated from the adhesive sheet by the pushup operation of said push-up needle.

2. The semiconductor chip-supply apparatus of claim 1, wherein said sucking member comprises a sucking portion at which the adhesive sheet is sucked by said sucking member, and said driving means is further for moving said sucking member downward such that said push-up needle penetrates said sucking portion of said sucking member in the push-up operation.

3. The semiconductor chip-supply apparatus of claim 1, wherein said sucking collet comprises a sucking face and a recess formed on said sucking face, said recess having an inner inclined contact surface for contacting corners of the semiconductor chip.

4. The semiconductor chip-supply apparatus of claim 2, wherein said sucking collet comprises a sucking face and a recess formed on said sucking face, said recess having an inner inclined contact surface for contacting corners of the semiconductor chip.

5. The semiconductor chip-supply apparatus of claim 1, wherein said drive means is further for moving said sucking member and the adhesive sheet downward while the push-up needle is stationary so as to cause the relatively downward movement of the sucking member and the adhesive sheet to perform the push-up operation.

6. A semiconductor chip-supply method, comprising the steps of:

sucking and holding an adhesive sheet with a sucking member from below the adhesive sheet with a semiconductor chip bonded to an upper face of the adhesive sheet;

moving the sucking member and the adhesive sheet downward relative to a push-up needle that has a tip thereof positioned adjacent to a lower face of the adhesive sheet such that the push-up needle is moved upward relative to the sucking member and the adhesive sheet that is sucked to and held by the sucking member so as to separate the semiconductor chip from the adhesive sheet by pushing up the semiconductor chip with the tip of the push-up needle; and sucking and transporting the semiconductor chip separated from the adhesive sheet with a sucking collet.

7. The semiconductor chip-supply method of claim 6, wherein when the push-up needle moves upward relative to the sucking member and the adhesive sheet the push-up needle penetrates a portion of the sucking member that is sucking the adhesive sheet.

8. The semiconductor chip-supply method of claim 6, wherein the sucking collet comprises a sucking face having a recess, the recess having an inner inclined surface that is brought into contact with corners of the semiconductor chip when the semiconductor chip is sucked and transported by the sucking collet.

9. The semiconductor chip-supply method of claim 7, wherein the sucking collet comprises a sucking face having a recess, the recess having an inner inclined surface that is brought into contact with corners of the semiconductor chip when the semiconductor chip is sucked and transported by the sucking collet.

10. The semiconductor chip-supply method of claim 6, wherein said step of moving further comprises moving the sucking member and the adhesive sheet downward so as to move the push-up needle upward relative to the sucking member and the adhesive sheet that is sucked to and held by the sucking member while the push-up needle is held stationary.

11. The method claim 6, wherein said step of moving further comprises moving the sucking member and the adhesive sheet downward relative to the push-up needle from a position in which the adhesive sheet extends downwardly from the sucking member at portions thereof adjacent to the sucking member.

* * * * *